(12) United States Patent
Pfirsch

(10) Patent No.: US 9,082,813 B2
(45) Date of Patent: Jul. 14, 2015

(54) POWER DEVICE AND A REVERSE CONDUCTING POWER IGBT

(71) Applicant: Infineon Technologies Austria AG, Villach (AT)

(72) Inventor: Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/748,172

(22) Filed: Jan. 23, 2013

(65) Prior Publication Data

US 2014/0027814 A1    Jan. 30, 2014

Related U.S. Application Data

(63) Continuation of application No. 13/007,902, filed on Jan. 17, 2011, now Pat. No. 8,384,151.

(51) Int. Cl.
*H01L 29/78* (2006.01)
*H01L 29/06* (2006.01)
*H01L 29/10* (2006.01)
*H01L 29/739* (2006.01)
*H01L 29/08* (2006.01)

(52) U.S. Cl.
CPC ........ *H01L 29/7395* (2013.01); *H01L 29/0696* (2013.01); *H01L 29/0834* (2013.01); *H01L 29/1095* (2013.01); *H01L 29/7397* (2013.01); *H01L 29/7802* (2013.01); *H01L 29/7813* (2013.01)

(58) Field of Classification Search
CPC ............ H01L 29/7802; H01L 29/7813; H01L 29/0696; H01L 29/1095
USPC .................................................. 257/328, 341
See application file for complete search history.

(56) References Cited

U.S. PATENT DOCUMENTS

| 5,998,836 | A | * | 12/1999 | Williams .................. 257/341 |
| 6,777,783 | B2 | | 8/2004 | Matsuda |
| 6,818,940 | B2 | | 11/2004 | Matsuda |
| 7,154,145 | B2 | | 12/2006 | Takahashi |

(Continued)

FOREIGN PATENT DOCUMENTS

| CN | 1430288 A | 7/2003 |
| CN | 1591902 A | 3/2005 |

(Continued)

*Primary Examiner* — Phat X Cao
(74) *Attorney, Agent, or Firm* — Murphy, Bilak & Homiller, PLLC

(57) ABSTRACT

A semiconductor device is provided which includes a semiconductor body having a base region and a main horizontal surface, and a first electrode arranged on the main horizontal surface. The semiconductor body further includes a plurality of vertical trenches having gate electrodes in a vertical cross-section. A body region forms a first pn-junction with the base region and extends between two of the vertical trenches. A source region is in ohmic contact with the first electrode and arranged between the two vertical trenches. An anti-latch-up region is arranged between the two vertical trenches and in ohmic contact with the first electrode. The anti-latch-up region has a maximum doping concentration which is higher than a maximum doping concentration of the body region. An anode region forms a rectifying pn-junction with the base region only and adjoins a third one of the vertical trenches, and has ohmic contact with the first electrode.

22 Claims, 13 Drawing Sheets

(56) References Cited

U.S. PATENT DOCUMENTS

| | | |
|---|---|---|
| 8,242,536 B2 | 8/2012 | Tanabe |
| 8,384,151 B2 * | 2/2013 | Pfirsch .................. 257/328 |
| 2005/0045960 A1 | 3/2005 | Takahashi |
| 2007/0069287 A1 | 3/2007 | Takahashi |
| 2009/0085103 A1 * | 4/2009 | Hille et al. ................. 257/330 |
| 2010/0187567 A1 | 7/2010 | Tanabe et al. |

FOREIGN PATENT DOCUMENTS

| | | |
|---|---|---|
| DE | 69617098 T2 | 4/2002 |
| DE | 102008045488 A1 | 4/2009 |
| DE | 102010001215 A1 | 11/2010 |
| JP | 2009170670 A | 7/2009 |
| JP | 2010186805 A | 8/2010 |

* cited by examiner

POWER DEVICE AND A REVERSE CONDUCTING POWER IGBT

PRIORITY CLAIM

This application is a Continuation of U.S. application Ser. No. 13/007,902, filed on Jan. 17, 2011, the content of said application incorporated herein by reference in its entirety.

TECHNICAL FIELD

This specification refers to embodiments of reverse conducting IGBTs, in particular to reverse conducting power IGBTs, and to semiconductor devices having a reverse conducting IGBT structure.

BACKGROUND

Many functions of modern devices in automotive, consumer and industrial applications, such as converting electrical energy and driving an electric motor or an electric machine, rely on semiconductor devices. Insulated Gate Bipolar Transistors (IGBTs) have been used for various applications including but not limited to switches in power supplies and power converters.

The direction of current flow through IGBTs operating as switches or motor drivers may be different in different operating cycles. In a "forward mode" of the IGBT, the pn-body diode at the body-drain junction of the IGBT is reversely biased and the resistance of the device can be controlled by the voltage applied to the gate electrode of the IGBT. To allow low ohmic current flow through the IGBT in a "reverse mode", in which the pn-body diode is forwardly biased, a structured collector region having portions of both doping types may be provided. The loss of the thereby monolithically integrated free-wheeling diode is, in reverse mode of the IGBT, mainly determined by the product of current flow and voltage drop across the body diode. IGBTs with monolithically integrated free-wheeling diodes are also termed reverse conducting IGBTs. These semiconductor devices avoid inductances and capacitances associated with the required contacts and supply lines of external free-wheeling diodes.

For reasons of high latch-up robustness, a highly doped anti-latch-up region is typically provided in the body region of IGBTs. In reverse mode, the anti-latch-up region operates as emitter region with high emitter efficiency of the integrated free-wheeling diode. This results in flooding of the drift zone, which in the following is also referred to as a base region, with minority charge carriers during reverse mode of the IGBT. Accordingly, the reverse current peak, the switching-off energy of the integrated free-wheeling diode and the switching-on energy of the IGBT are often too high for IGBTs with monolithically integrated free-wheeling diode, in particular in hard-switching applications.

To reduce the flooding of the base region with minority charge carriers in reverse mode, the life time of the minority charge carriers may be reduced in the base region, for example by using rapid gold or platinum diffusion or by irradiating the semiconductor body of the IGBT during processing with high energetic particles such as electrons or protons. However, the reduction of charge carrier life time typically results both in an increased forward voltage $V_F$ and in an increased saturation forward voltage $V_{CEsat}$. This in turn increases the power loss of the IGBT in forward mode.

SUMMARY

According to an embodiment, a semiconductor device is provided. The semiconductor device includes a semiconductor body having a base region of a first conductivity type and a main horizontal surface. A first electrode is arranged on the main horizontal surface. The semiconductor body further includes an IGBT-cell and a diode-cell. The IGBT-cell includes, in a vertical cross-section, a body region of a second conductivity type forming a first pn-junction with the base region. The diode-cell includes, in the vertical cross-section, an anode region of the second conductivity type forming a second pn-junction with the base region. A source region of the first conductivity type in ohmic contact with the first electrode and an anti-latch-up region of the second conductivity type in ohmic contact with the first electrode are, in the vertical cross-section, only formed in the IGBT-cell. The anti-latch-up region has a maximum doping concentration which is higher than a maximum doping concentration of the body region.

According to an embodiment, a reverse conducting IGBT is provided. The reverse conducting IGBT includes a semiconductor body with a base region of a first conductivity type and a main horizontal surface. A first electrode is arranged on the main horizontal surface. The semiconductor body further includes, in a vertical cross-section, a first vertical trench having a first gate electrode insulated by a gate dielectric region, a second vertical trench having a second gate electrode insulated by a gate dielectric region, and a third vertical trench having a third gate electrode insulated by a gate dielectric region. In the vertical cross-section, a body region of a second conductivity type forms a first pn-junction with the base region and extends between the first vertical trench and the second vertical trench. A source region of the first conductivity type in ohmic contact with the first electrode is, in the vertical cross-section, arranged between the first vertical trench and the second vertical trench. In the vertical cross-section an anode region of the second conductivity type adjoins the third vertical trench and forms a rectifying pn-junction with the base region only. The semiconductor body further includes an anti-latch-up region of the second conductivity type in ohmic contact with the first electrode and with a maximum doping concentration which is higher than a maximum doping concentration of the body region. In the vertical cross-section, the anti-latch-up region extends vertically deeper into the body region than the source region and is only arranged between the first vertical trench and the second vertical trench.

According to an embodiment, a reverse conducting IGBT is provided. The reverse conducting IGBT includes a semiconductor body with a base region of a first conductivity type and a main horizontal surface. A first electrode is arranged on the main horizontal surface. The semiconductor body further includes, in a vertical cross-section, a first gate electrode insulated by a gate dielectric region, a second gate electrode insulated by a gate dielectric region, and a body region of a second conductivity type forming a first pn-junction with the base region and adjoining the gate dielectric region of the first gate electrode and the gate dielectric region of the second gate electrode. A source region of the first conductivity type in Ohmic contact with the first electrode adjoins, in the vertical cross-section, the gate dielectric region of the first gate electrode. The semiconductor body further includes an anti-latch-up region of the second conductivity type in ohmic contact with the first electrode. The anti-latch-up region has a maximum doping concentration which is higher than a maximum doping concentration of the body region. The anti-latch-up region further has, in the vertical cross-section, a first minimum distance to the gate dielectric region of the first gate electrode and a second minimum distance to the gate dielectric region of the second gate electrode. The second minimum distance is larger than the first minimum distance.

According to an embodiment, a reverse conducting IGBT is provided. The reverse conducting IGBT includes a semiconductor body with a base region of a first conductivity type and a main horizontal surface. A first electrode is arranged on the main horizontal surface. The semiconductor body further includes, in a vertical cross-section, a first vertical trench having a first gate electrode insulated by a gate dielectric region, a second vertical trench having a second gate electrode insulated by a gate dielectric region, and a body region of a second conductivity type which forms a first pn-junction with the base region, and which extends between the first vertical trench and the second vertical trench and to the first electrode. A source region of the first conductivity type in ohmic contact with the first electrode adjoins, in the vertical cross-section, the gate dielectric region of the first gate electrode. An anti-latch-up region of the second conductivity type extends, in the vertical cross-section, vertically deeper into the body region than the source region. The anti-latch-up region is in ohmic contact with the first electrode and has a maximum doping concentration which is higher than a maximum doping concentration of the body region.

According to another embodiment of a semiconductor device, the semiconductor device comprises a semiconductor body comprising a base region of a first conductivity type and a main horizontal surface and a first electrode arranged on the main horizontal surface. The semiconductor body further comprises, in a vertical cross-section: a first vertical trench comprising a first gate electrode insulated by a gate dielectric region from the base region; a second vertical trench comprising a second gate electrode insulated by a gate dielectric region from the base region; a third vertical trench comprising a third gate electrode insulated by a gate dielectric region from the base region; a body region of a second conductivity type forming a first pn-junction with the base region and extending between the first vertical trench and the second vertical trench; at least one source region of the first conductivity type in ohmic contact with the first electrode and arranged between the first vertical trench and the second vertical trench; at least one anti-latch-up region of the second conductivity type arranged between the first vertical trench and the second vertical trench and in ohmic contact with the first electrode and having a maximum doping concentration which is higher than a maximum doping concentration of the body region; and an anode region of the second conductivity type forming a rectifying pn-junction with the base region only and adjoining the third vertical trench, wherein the anode region is in ohmic contact with the first electrode.

According to yet another embodiment of a semiconductor device, the semiconductor device comprises a semiconductor body comprising a base region of a first conductivity type and a main horizontal surface and a first electrode arranged on the main horizontal surface. The semiconductor body further comprises, in a vertical cross-section: a first vertical trench comprising a first gate electrode insulated by a gate dielectric region from the base region; a second vertical trench comprising a second gate electrode insulated by a gate dielectric region from the base region; a body region of a second conductivity type forming a first pn-junction with the base region and extending between the first vertical trench and the second vertical trench; a first source region of the first conductivity type in ohmic contact with the first electrode and adjoining the first vertical trench; a second source region of the first conductivity type in ohmic contact with the first electrode and adjoining the second vertical trench; and at least one anti-latch-up region of the second conductivity type in ohmic contact with the first electrode vertically below the first electrode, and in contact with and arranged between the first source region and the second source region, wherein the anti-latch-up region has a maximum doping concentration which is higher than a maximum doping concentration of the body region, and wherein the body region is in electric contact with the first electrode only via the at least one anti-latch-up region, the first source region and the second source region.

According to still another embodiment of a semiconductor device, the semiconductor device comprises a semiconductor body comprising a base region of a first conductivity type and a main horizontal surface and a first electrode arranged on the main horizontal surface. The semiconductor body further comprises, in a vertical cross-section: a first gate electrode insulated by a gate dielectric region and arranged at least partially vertically above the main horizontal surface; a body region of a second conductivity type forming a first pn-junction with the base region, the body region vertically extending below the first electrode and below the first gate electrode; a source region of the first conductivity type in ohmic contact with the first electrode and arranged vertically below the first gate electrode and the first electrode; an anti-latch-up region of the second conductivity type vertically arranged below the and in ohmic contact with the first electrode and having a maximum doping concentration which is higher than a maximum doping concentration of the body region; and an anode region of the second conductivity type forming a rectifying pn-junction with the base region only and at least partially arranged vertically below the first gate electrode. The first gate electrode and the second gate electrode are insulated from the first electrode.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
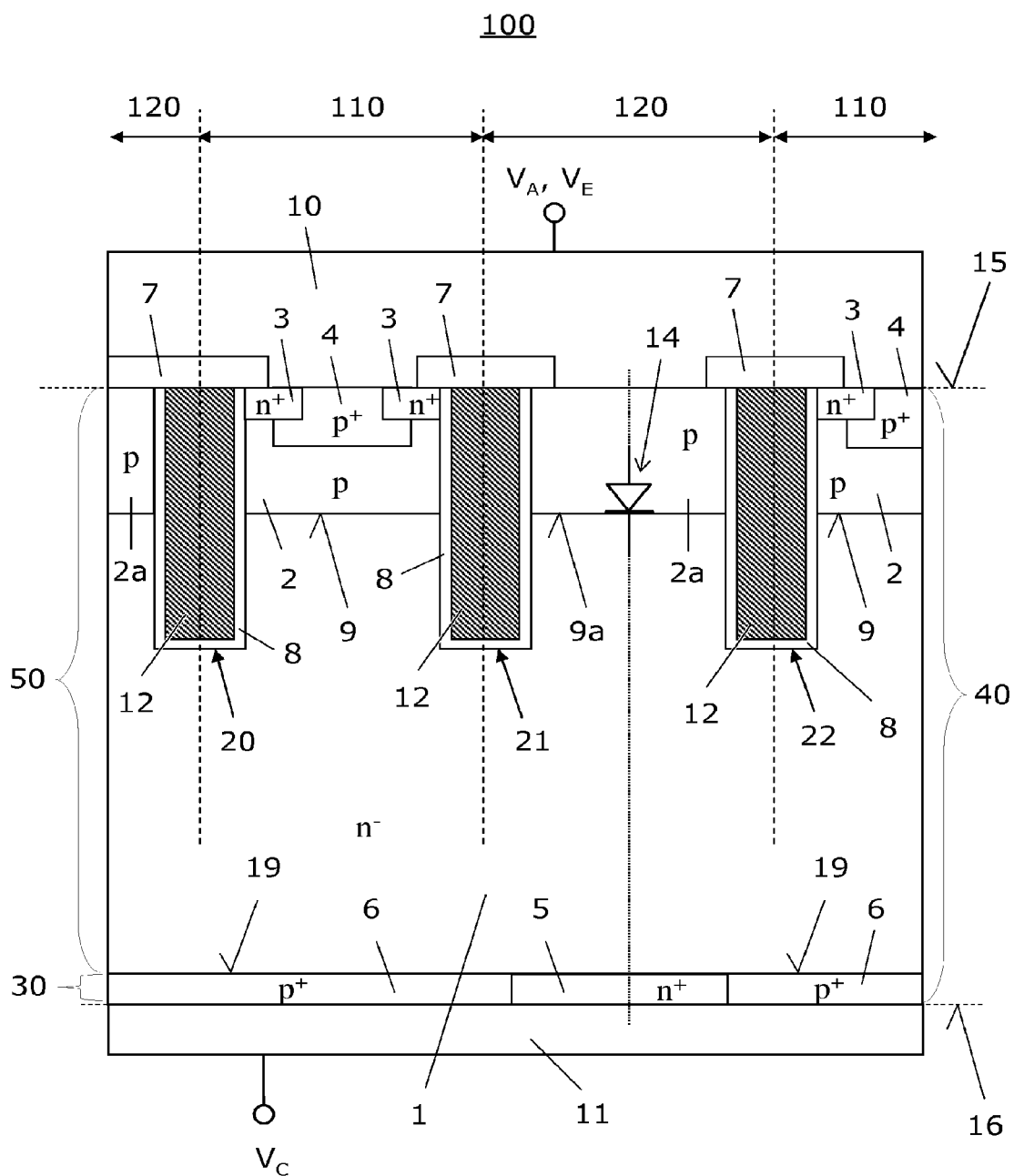
FIG. 1 schematically illustrates a vertical cross-section of a vertical semiconductor device according to one or more embodiments.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, monolithically integrated semiconductor devices having a reverse conducting IGBT structure, in particular to power semiconductor devices such as reverse conducting power IGBTs.

The term "power semiconductor device" as used in this specification intends to describe a semiconductor device on a single chip with high voltage and/or high current switching capabilities. In other words, power semiconductor devices are intended for high current, typically in the Ampere range, and/or high voltages, typically above 400 V, more typically above 600 V.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor devices or between different terminals of one or more devices or between a terminal or a metallization or an electrode and a portion or part of a semiconductor device.

FIG. 1 schematically illustrates an embodiment of a semiconductor device 100 in a section of a vertical cross-section. The semiconductor device 100 includes a semiconductor body 40 having a first or main horizontal surface 15 and a second surface or back surface 16 arranged opposite the first surface 15. The normal direction $e_n$ of the first surface 15 is substantially parallel to the vertical direction.

The semiconductor body 40 can be a single bulk mono-crystalline material. The semiconductor body 40 can also include a bulk mono-crystalline material 30 and at least one epitaxial layer 50 formed thereon. Using epitaxial layers 50 provides more freedom in tailoring the background doping of the material since the doping concentration can be adjusted during deposition of the epitaxial layer or layers.

In the following, embodiments pertaining to semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

Semiconductor body 40 includes an n-type base region 1 which is arranged between the back surface 16 and the main horizontal surface 15. A first electrode 10 is arranged on the main horizontal surface 15 and a second electrode 11 is arranged on the back surface 16. A first vertical trench 20, a second vertical trench 21 and a third vertical trench 22 extend from the main horizontal surface 15 partially into the base region 1. Each vertical trench 20, 21, 22 includes a respective gate electrode 12 which is insulated by a respective gate dielectric region 8 from the semiconductor body 40 and by an insulating plug 7 from the first electrode 11.

A p-type body region 2 extends between the first vertical trench 20 and the second vertical trench 21, i.e. between the gate dielectric regions 8 of the vertical trenches 20, 21. The body region 2 forms a first pn-junction 9 with the base region 1. Two n$^+$-type source regions 3 in ohmic contact with the first electrode 10 are arranged between the first vertical trench 20 and the second vertical trench 21. Each of the two source regions 3 adjoins one of the first vertical trench 20 and the second vertical trench 21.

A p$^+$-type anti-latch-up region 4 in ohmic contact with the first electrode 10 is arranged between the first vertical trench 20 and the second vertical trench 21. The anti-latch-up region 4 provides a low ohmic contact between the first electrode 10 and the body region 2. In the exemplary embodiment illustrated in FIG. 1, the anti-latch-up region 4 adjoins the two source regions 3.

A further pn-junction 19 is arranged vertically below the first pn-junction 9 and formed between the base region 1 and a p$^+$-type backside hole emitter region 6 in ohmic contact with the second electrode 11. Accordingly, the source regions 3 form with the body region 2, the base region 1 and the backside hole emitter region 6 a thyristor structure between the first and second electrodes 10, 11 and between the insulated gate electrodes 12 in the first vertical trench 20 and the second vertical trench 21, respectively. The insulated gate electrodes 12 extend vertically from the main horizontal surface 15 below the first pn-junction 9. Accordingly, an n-type channel region may be formed in the body region 2 along the respective insulating region 8 between the source region 3 and the base region 1 by appropriately biasing the gate electrode 12 relative to the first electrode 10. In other words, the semiconductor device 100 includes an IGBT-cell 110 with an anti-latch-up region 4 and may thus be operated as an IGBT. Accordingly, the first electrode 10 may form an emitter electrode 10 and the second electrode 11 may form a collector electrode 11.

In forward mode of the semiconductor device 100, the gate voltage $V_g$ applied to the gate electrodes 12 exceeds the emitter voltage $V_E$ applied to the first electrode 10 such that channel regions are formed in the body region 2 of each IGBT-cell 110 and the collector voltage $V_C$ applied to the second electrode 11 is higher than the emitter voltage $V_E$.

During forward mode, holes are injected into the base region 1 from the backside hole emitter regions 6 forming collector regions 6. A part of the injected holes recombine in the base region 1 with electrons from the channel regions. Another part of the injected holes, which are attracted by the electrons in the channel regions, travel across the first pn-junctions 9 and thus a voltage drop in the body regions 2 is formed.

This voltage drop tends, in an IGBT-cell structure having no anti-latch-up region, to forwardly bias the pn-junctions formed between the source regions and the body region. At large enough voltage drop, electrons are injected from the source regions into the body region. Accordingly, a parasitic npn transistor formed by the source region, the body region and the base region as well as a parasitic pnp transistor formed by the body region, the base region and the collector region may be turned on. In such an event, the thyristor formed by the parasitic npn transistor and the parasitic pnp transistor latches up. The IGBT-cell structure is now in a latch-up state. During latch-up, the gate electrodes have no control on the current between the source region and the collector region.

Latch-up of the two IGBT-cells 110 illustrated in FIG. 1 is avoided by the respective anti-latch-up regions 4 having a maximum doping concentration, which is higher than a maximum doping concentration of the adjoining body region 2, and extending vertically deeper, typically by a factor of 1.5 or more, into the adjoining body region 2 than the source regions 3. In so doing, non-latch-up operation of IGBT-cells 110 is typically provided over the entire operation range of semiconductor device 100. Typically, the maximum doping concentration of the anti-latch-up regions 4 is at least ten times higher than the maximum doping concentration of the adjoining body region 2.

Furthermore, the second electrode 11 is typically in ohmic contact with the base region 1 via an n-type contact region or backside n-emitter region 5 which is arranged between the second electrode 11 and base region 1 and has a maximum doping concentration which is higher than a maximum doping concentration of the base region 1. Accordingly, a current may also flow in a reverse mode, in which the collector voltage $V_C$ is lower than the emitter voltage $V_E$, between the first and second electrodes 10, 11 and across the forwardly biased first pn-junction 9. In other words, semiconductor device 100 has a first integrated free-wheeling diode, with its current path running across the body diode formed between the body region 2 and the base region 1, and may thus be operated as a reverse conducting semiconductor device 100.

According to an embodiment, a p-type anode region 2a extends between the second vertical trench 21 and the third vertical trench 22 and forms a second pn-junction 9a with the base region 1 only. In other words, no source regions 3 are, in the shown vertical cross-section, formed in the anode region 2a, i.e. between the second vertical trench 21 and the third vertical trench 22. Typically, no anti-latch-up region is, in the shown vertical cross-section, formed between the second vertical trench 21 and the third vertical trench 22.

Semiconductor device 100 may include an IGBT-cell 110 and a diode-cell 120 with an anode region 2a forming a second pn-junction 9a with the base region 1. Accordingly, semiconductor device 100 further includes an additional integrated free-wheeling diode 14 which is connected in parallel to the first integrated free-wheeling diode, i.e. between the second electrode 11 and the first electrode 10 which forms an anode for the integrated free-wheeling diodes. Compared to reverse conducting IGBTs having only a first integrated free-wheeling diode, semiconductor device 100 offers more freedom in optimizing the device performance with respect to latch-up robustness and switching performance.

The contact region 5 and the anode region 2a may overlap in a projection on a horizontal plane. Accordingly, a short current path through the additional integrated free-wheeling diode 14 may be provided in reverse mode of the semiconductor device 100.

The maximum doping concentration of the anti-latch-up region 4 is typically at least 10 times higher than the maximum doping concentration of the anode region 2a. Because the diode-cell 120 does not have an anti-latch-up region, the hole emitting efficiency between the body region 2 and the base region 1 is higher than the hole emitting efficiency between the anode region 2a and the base region 1. Due to the lower hole emitting efficiency of the additional integrated free-wheeling diode 14, the flooding of base region 1 with holes may be substantially reduced in reverse mode. On the other hand, the latch-up stability of the IGBT-cell 110 in forward mode is maintained. Accordingly, the reverse current peak and the reverse recovery energy of semiconductor device 100 and the switching-on energy of the IGBT-cell 110 are reduced compared to IGBTs using only the body diode as an integrated free-wheeling diode. Accordingly, the semiconductor device 100 is typically better suited for switching applications, in particular hard-switching applications.

Semiconductor device 100 may also be described as a reverse conducting trench IGBT 100 with separated IGBT-cells 110 and diode cells 120, whereas the hole emitting efficiency of the diode cells 120 is lower, typically three to ten times lower, than the hole emitting efficiency of the body diode of the IGBT-cells 110.

According to an embodiment, the semiconductor device 100 is a vertical power semiconductor device with an active area having a plurality of IBGT-cells 110 and/or diode-cells 120 for carrying and/or controlling a load current, and a peripheral area with an edge-termination structure. In these embodiments, the IGBT-cell 110 arranged between the first vertical trench 20 and the second vertical trench 21 and the diode-cell 120 arranged between the second vertical trench 21 and the third vertical trench 22 may correspond to a unit cell of the active area. The unit cells may be arranged on a horizontal one- or two-dimensional lattice, for example on a hexagonal or quadratic lattice. The IGBT-cells 110 and the diode-cells 120 may also be arranged on different horizontal lattices. Alternatively, only the IGBT-cells 110 or only the diode-cells 120 are arranged on a horizontal lattice.

Furthermore, the contact region 5 and/or the collector regions 6 may horizontally extend over several IGBT-cells 110 and/or diodes-cells 120 in a power semiconductor device 100. At low current densities in forward mode, a unipolar electron current through base region 1 and the n-emitter region 5 may result in a non-monotonic current-voltage characteristic. This is typically avoided or at least reduced when the collector regions 6 extend over several IGBT-cells 110 and/or diodes-cells 120.

The semiconductor device 100 may, however, include only one or a few IGBT-cells 110 and only one or a few diode-cells 120, for example as part of an integrated circuit and/or in high frequency low power applications.

FIG. 1 represents one typical cross-sectional view. Other cross-sectional views of the semiconductor device 100 may be similar, for example when the illustrated semiconductor regions, insulating regions, electrodes and vertical trenches are, in a direction which is perpendicular to the illustrated cross-section, substantially bar-shaped. It is, however, also possible that the body regions 2 and the anti-latch-up regions 4 are square or disc-shaped and that the first and second vertical trenches 20, 21 correspond to a single connected, e.g. ring-shaped vertical trench. In these embodiments, the two illustrated separated source regions 3 of the left IGBT-cell 11 typically also correspond to a single connected, e.g. ring-shaped, source region.

Furthermore, the order of IGBT-cells 110 and diode-cells 120 may change, for example alternate, in a direction which is perpendicular to the illustrated cross-section in FIG. 1. This means that in a further vertical cross-section, which is parallel to the cross-section of FIG. 1, a further p-type anti-latch-up region as well as further two source regions may be arranged between the second vertical trench 21 and the third vertical trench 22. In these embodiments, there are typically no anti-latch-up region and no source regions arranged between the first vertical trench 20 and the second vertical trench 21, in the further vertical cross-section.

Figure 2:
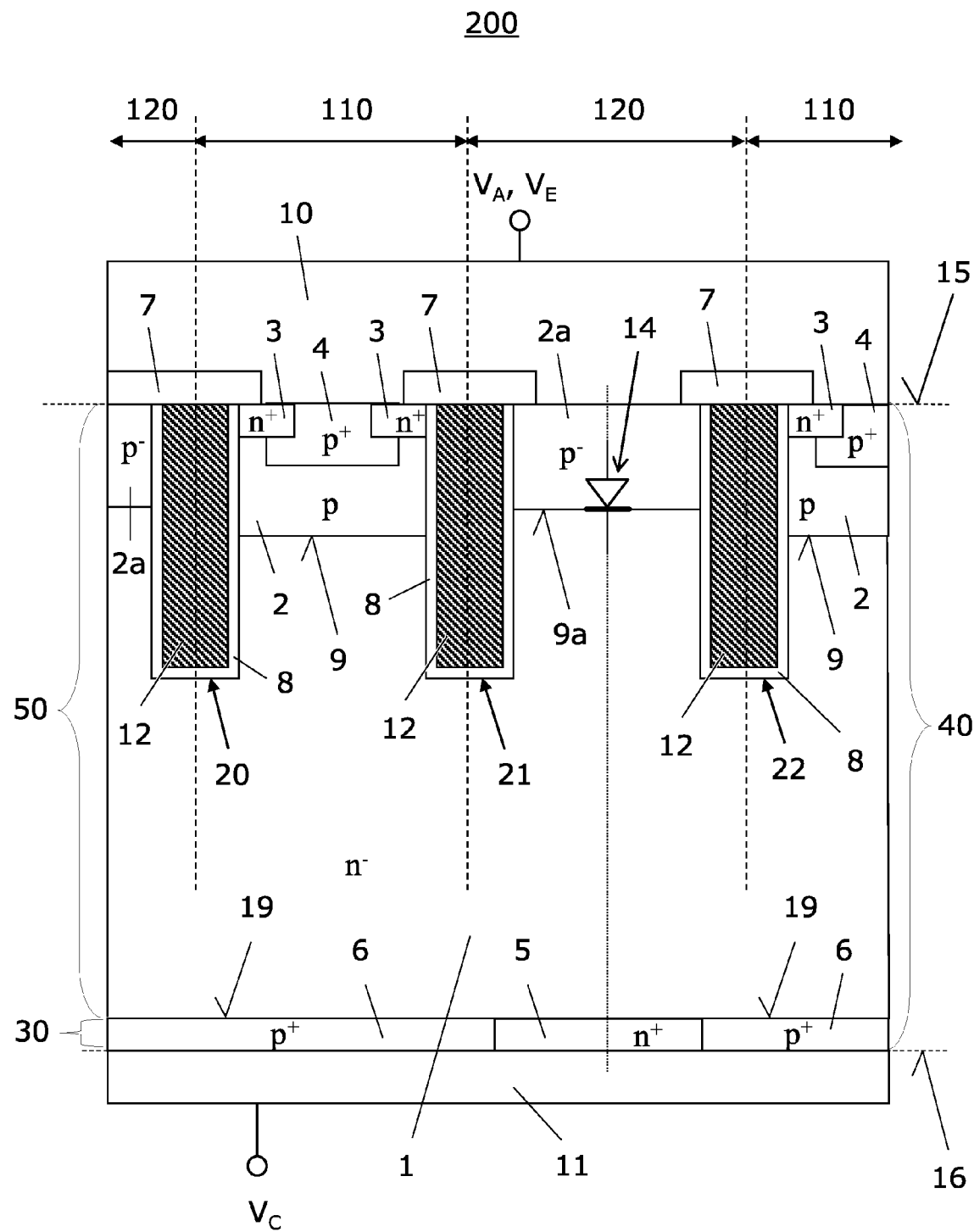
FIG. 2 schematically illustrates a vertical cross-section of a vertical semiconductor device according to one or more embodiments.

FIG. 2 schematically illustrates an embodiment of a semiconductor device 200 in a section of a vertical cross-section. Semiconductor device 200 is similar to semiconductor device 100 and may also be operated as a reverse-conducting IGBT. However, the anode region 2a extends vertically less deep into the semiconductor body 40. Furthermore, the maximum doping concentration of the anode region 2a is lower than the maximum doping concentration of the body region 2. Accordingly, the hole emitting efficiency between the anode region 2a and the base region 1 is further reduced compared to the hole emitting efficiency between the body region 2 and the base region 1. Thus, the reverse current peak and the reverse recovery energy of the semiconductor device 100 and the switching-on energy of the IGBT-cells 110 are reduced.

According to an embodiment, the maximum doping concentration of the body region 2 is at least two times higher, more typically five times higher, and even more typically ten times higher than the maximum doping concentration of the anode region 2a.

For example, the maximum doping concentration of the anti-latch-up region 4 is higher than about $10^{19}$ cm$^{-3}$, the maximum doping concentration of the body region 2 lies between about $5*10^{16}$ cm$^{-3}$ and about $5*10^{17}$ cm$^{-3}$ and the maximum doping concentration of the anode region 2a is below about $5*10^{16}$ cm$^{-3}$. The maximum doping concentration of the base region 1 typically lies between about $5*10^{12}$ cm$^{-3}$ and about $5*10^{14}$ cm$^{-3}$, for example in the region of about $5*10^{13}$ cm$^{-3}$.

Figure 3:
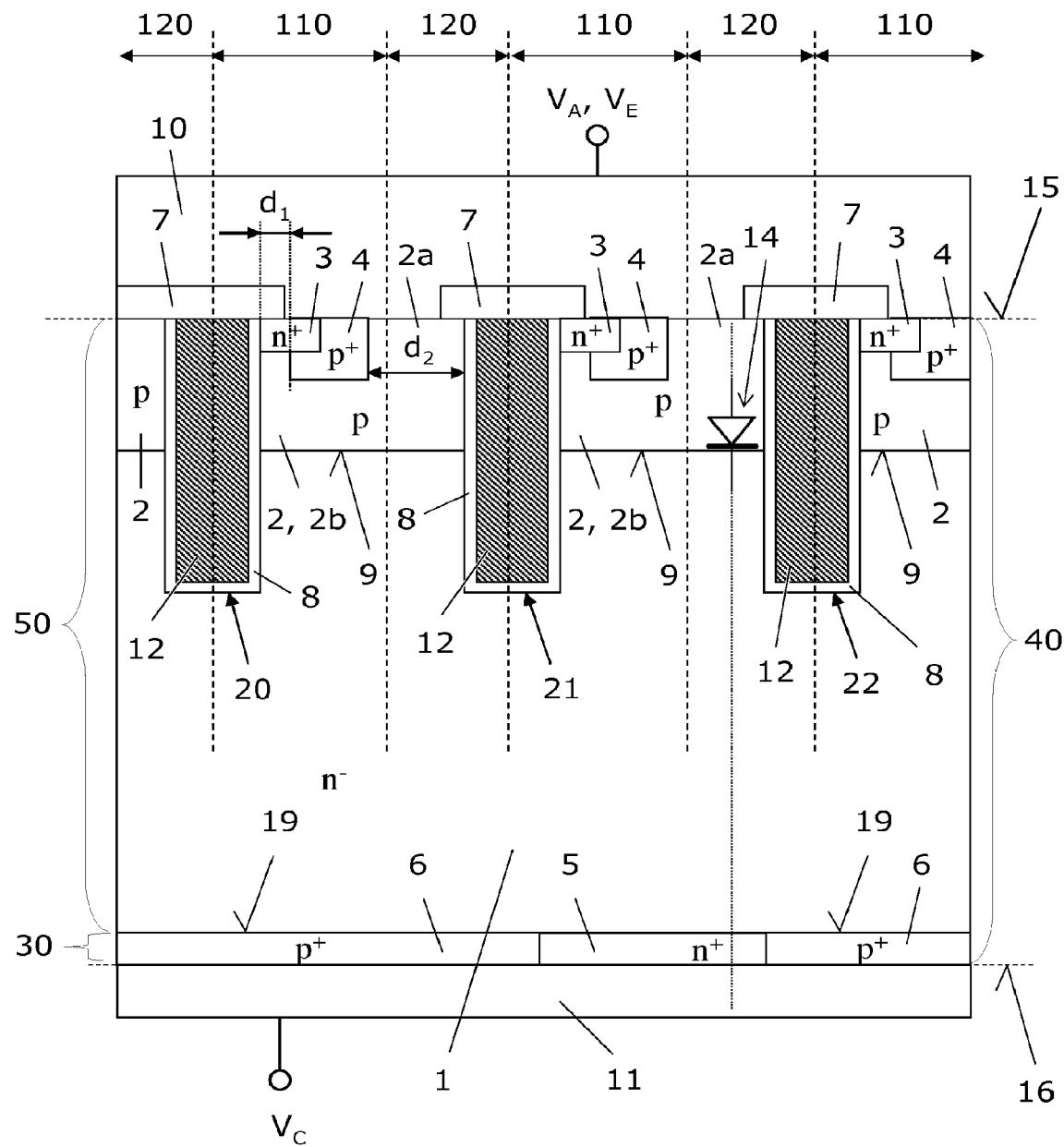
FIG. 3 schematically illustrates a vertical cross-section of a vertical semiconductor device according to one or more embodiments.

FIG. 3 schematically illustrates an embodiment of a semiconductor device 300 in a section of a vertical cross-section. Semiconductor device 300 also includes an IGBT-cell 110 and a diode-cell 120 which are however not separated from each other by a common trench gate electrode as illustrated in FIGS. 1 and 2, but share a p-type hole emitter region 2 or body region 2 which is arranged between two neighboring trench gate electrodes 12.

Each of the three illustrated IGBT-cells 110 includes, in the vertical cross-section, only one source region 3 in ohmic contact with the first electrode 10. For example, only one source region 3 is arranged between the first trench 20 and the second trench 21. In the exemplary embodiment illustrated in FIG. 3, each vertical trench 20, 21, 22 adjoins only one of the source regions 3. Accordingly, the body regions 2 extend to the first electrode 10 and the main horizontal surface 15, respectively.

Semiconductor device 300 may also be described as a reverse conducting trench IGBT 300 with at least one combined IGBT-cell 110 and diode-cell 120 arranged between two neighboring trench gate electrodes 12. The IGBT-cell 110 includes a first portion 2b of the body region 2 in which the source region 3 and the anti-latch-up region 4 are embedded. The diode-cell 120 includes an adjoining second portion 2a of the body region 2 without any source region. Typically, the second portion 2a contains no n-type semiconductor regions and thus forms a rectifying pn-junction 9a with the base region 1 only.

In other words, the body region 2 includes a first portion 2b overlapping, in a projection on a horizontal plane, with the source region 3 and the anti-latch-up region 4 and a second portion 2a which is, in the projection on the horizontal plane, spaced apart from the source region 3 and the anti-latch-up region 4. Furthermore, the second portion 2a extends to the first electrode 10. Accordingly, the second portion 2a of the body region 2 forms an anode region 2a of an integrated additional free-wheeling diode 14. In so doing, the hole emitting efficiency of the diode cell 120 is lower, typically three to ten times lower, than the hole emitting efficiency of the body diode of the IGBT-cell 110 formed between the first portion 2b of the body region 2 and the base region 1.

According to an embodiment, a minimum distance d1 between the anti-latch-up region 4 and the gate dielectric region 8 of the gate electrode 12 in the first vertical trench 20 is smaller, typically by a factor of two or more, than a minimum distance d2 between the anti-latch-up region 4 and the gate dielectric region 8 of the gate electrode 12 in the second vertical trench 21. In so doing, a large enough portion of the current may flow through the integrated additional free-wheeling diode 14 in reverse mode of semiconductor device 300. This reduces flooding of the base region 1 with holes during reverse mode of the semiconductor device 300.

Figure 4:
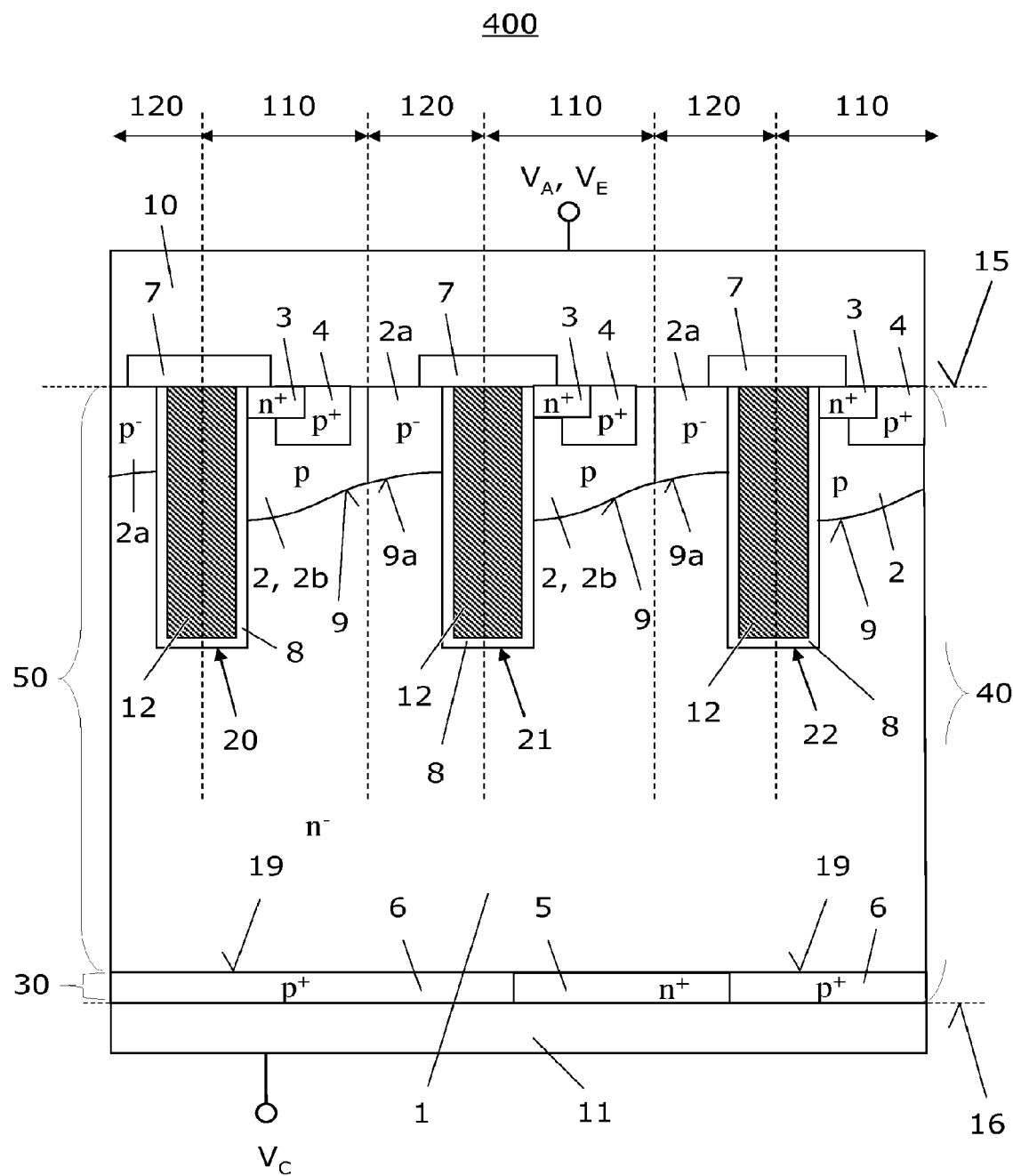
FIG. 4 schematically illustrates a vertical cross-section of a vertical semiconductor device according to one or more embodiments.

FIG. 4 schematically illustrates an embodiment of a semiconductor device 400 in a section of a vertical cross-section. Semiconductor device 400 is similar to semiconductor device 300 and may also be operated as a reverse-conducting IGBT.

According to an embodiment, a maximum doping concentration of the first portion 2b of the body region 2 is higher, typically by factor of two, more typically by a factor of five, and even more typically by a factor of ten than a maximum doping concentration of the second portion 2a forming an anode region 2a. In so doing, the hole emitting efficiency of the diode cell 120 is further reduced.

Furthermore, the first portion 2b of the body region 2 extends typically vertically deeper into the semiconductor body 40 than the second portion 2a. The first portion 2b and the second portion 2a may be formed in a common drive-in process after implanting a higher dopant dose into the first portions 2b.

Figure 5:
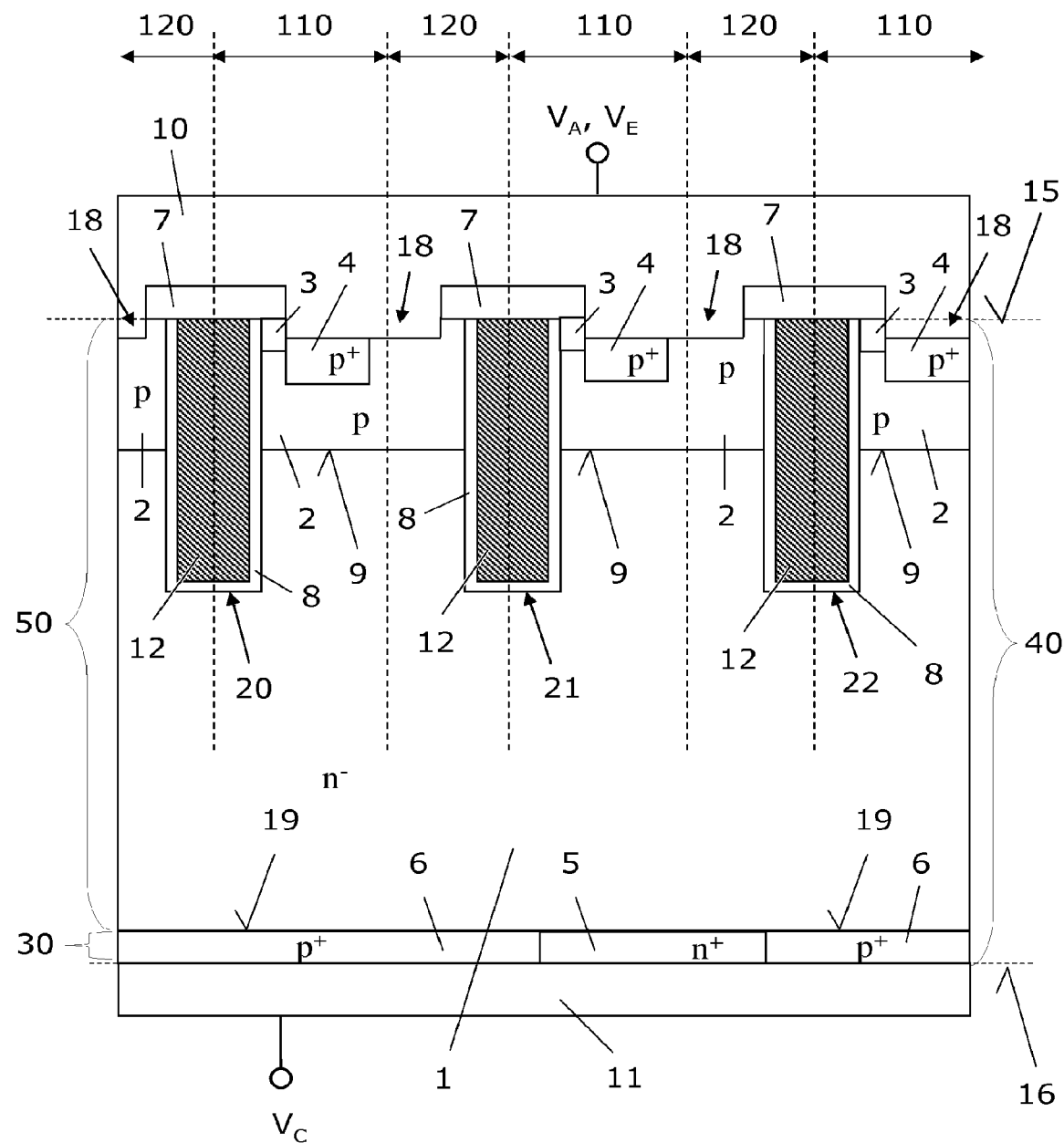
FIG. 5 schematically illustrates a vertical cross-section of a vertical semiconductor device according to one or more embodiments.

FIG. 5 schematically illustrates an embodiment of a semiconductor device 500 in a section of a vertical cross-section. Semiconductor device 500 is similar to semiconductor device 300 and may also be operated as a reverse-conducting IGBT. However, shallow contact trenches 18 are used to electrically connect the source regions 3 and the anti-latch-up regions 4 with the first electrode 10. The shallow contact trenches 18 may alternatively also be used for the semiconductor devices 100, 200, 400 and the semiconductor devices explained with reference to the following figures.

Figure 6:
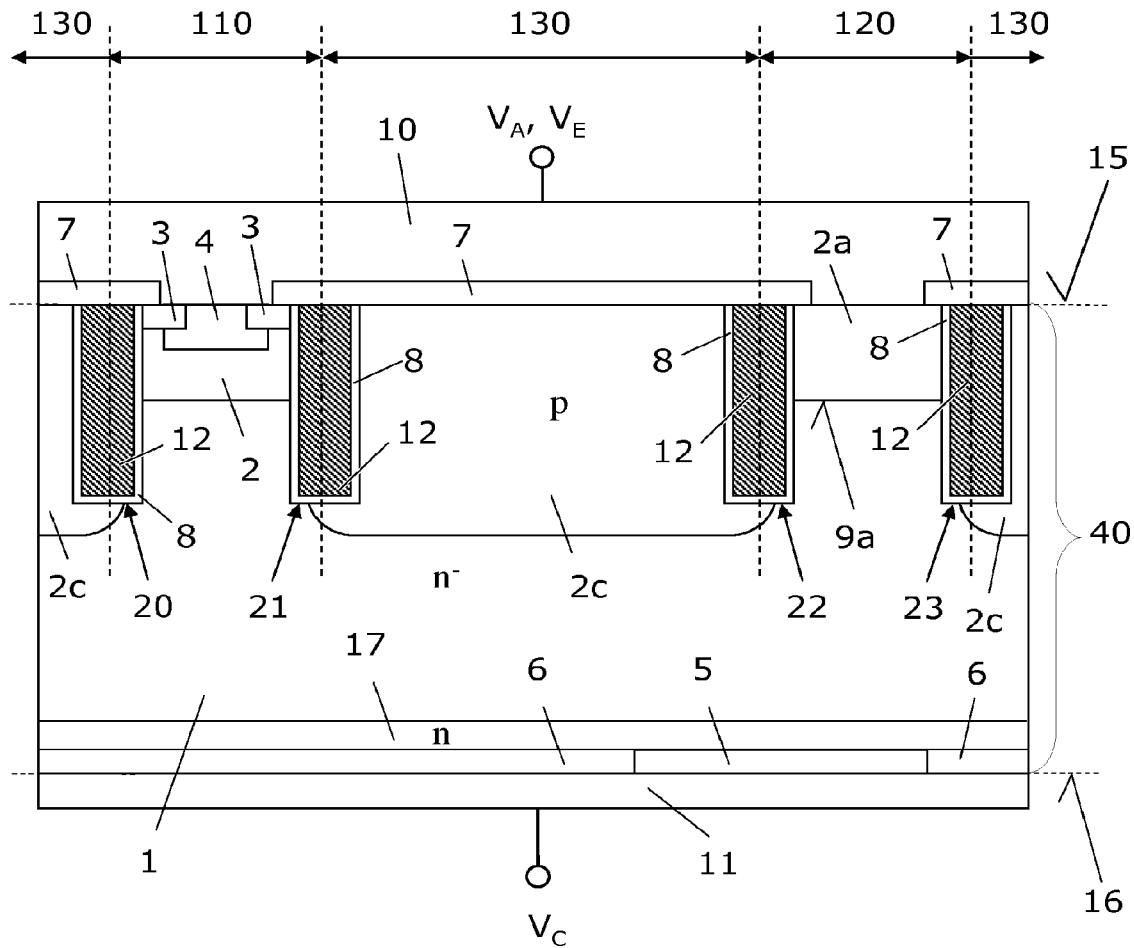
FIG. 6 schematically illustrates a vertical cross-section of a vertical semiconductor device according to one or more embodiments.

FIG. 6 schematically illustrates an embodiment of a semiconductor device 600 in a section of a vertical cross-section. Semiconductor device 600 is similar to semiconductor device 100 and may also be operated as a reverse-conducting IGBT. However, spacer-cells 130 with a respective p-type floating semiconductor region 2c are arranged between the IGBT-cells 110 and the diode-cells 120. In the exemplary embodiment illustrated in FIG. 6, the body region 2 of the IGBT-cell 110 extends between the first vertical trench 20 and the second vertical trench 21. The floating body region 2c of the spacer-cell 130 extends between the second vertical trench 21 and the third vertical trench 22. The anode region 2a of the diode-cell 120 extends between the third vertical trench 22 and a fourth vertical trench 23. A maximum doping concentration of the floating semiconductor region 2c is typically substantially equal to or higher than the maximum doping concentration of the body region 2.

According to an embodiment, the floating semiconductor region 2c extends vertically deeper into the base region 1 than the body regions 2, the anode regions 2a, and the vertical trenches 20, 21, 22 and 23.

According to an embodiment, an n-type field-stop zone 17 is arranged between the base region 1 and the backside n-emitter region 5 and between the base region 1 and the backside p-emitter region or collector region 6. Accordingly, the semiconductor device 600 may be operated as a reverse conducting punch-through IGBT. Furthermore, a field-stop zone may also be provided for the other semiconductor devices disclosed herein.

Figure 7:
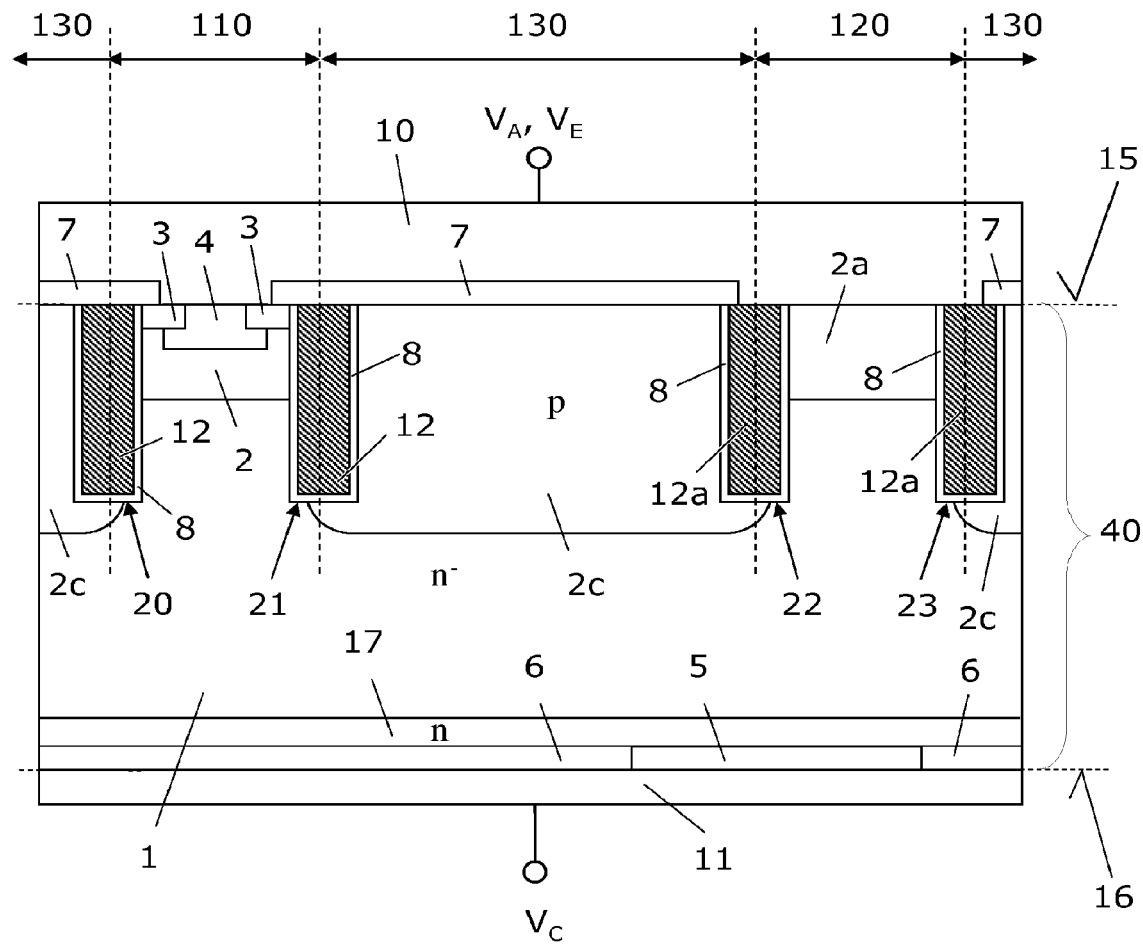
FIG. 7 schematically illustrates a vertical cross-section of a vertical semiconductor device according to one or more embodiments.

FIG. 7 schematically illustrates an embodiment of a semiconductor device 700 in a section of a vertical cross-section. Semiconductor device 700 is similar to semiconductor device 600 and may also be operated as a reverse-conducting IGBT. However, the insulated gate electrodes 12a arranged in the third vertical trench 22 and the fourth vertical trench 23 are connected to the first electrode 10. Accordingly, the insulated electrodes 12a are on emitter voltage $V_A$ instead of gate voltage during operation. In so doing, the gate capacitance is typically reduced. Accordingly, switching characteristics of the semiconductor device 700 may be improved. The term "gate electrode" as used in this specification intends to describe an electrode which is insulated from the semiconductor body independent on whether the gate electrode is actually connected to gate potential during operation.

Figure 8:
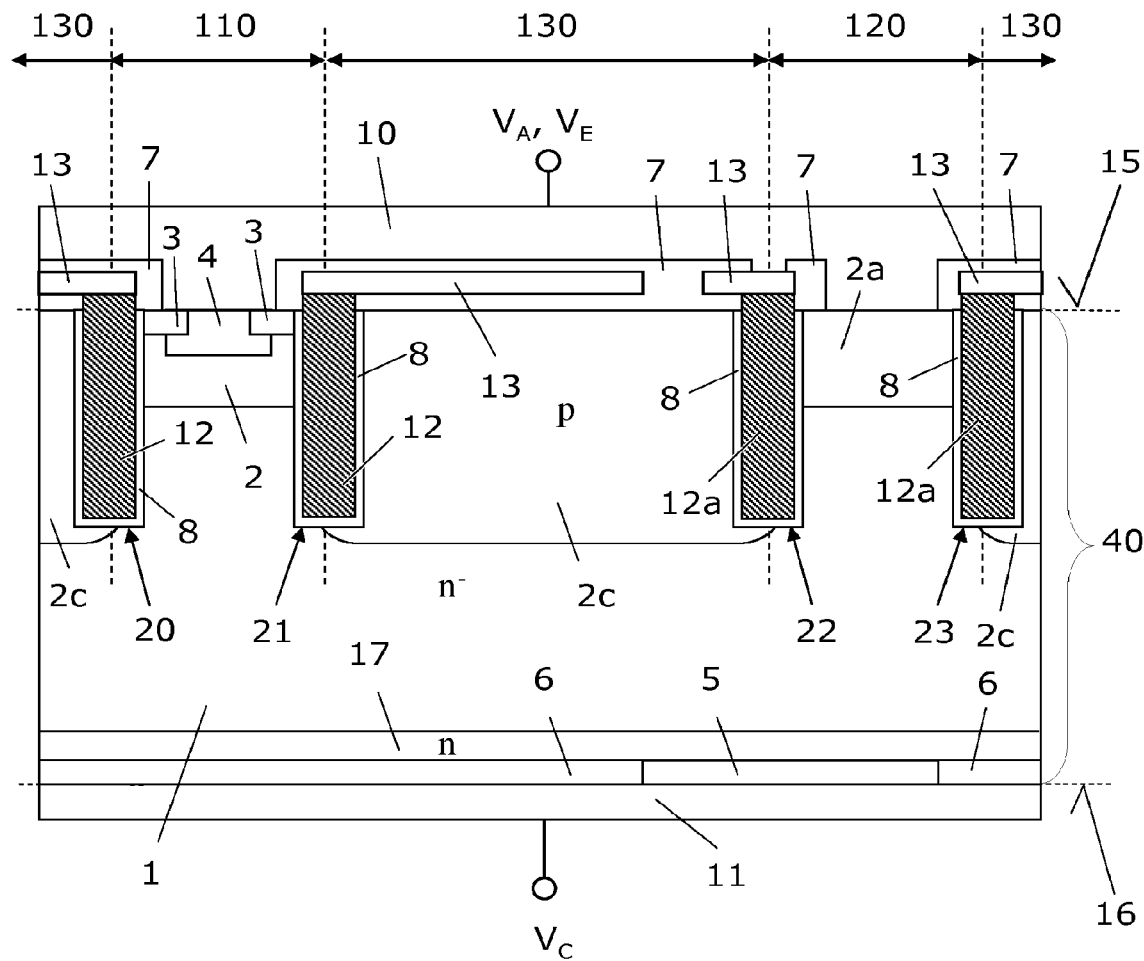
FIG. 8 schematically illustrates a vertical cross-section of a vertical semiconductor device according to one or more embodiments.

FIG. 8 schematically illustrates an embodiment of a semiconductor device 800 in a section of a vertical cross-section. Semiconductor device 800 is similar to semiconductor device 700 and may also be operated as a reverse-conducting IGBT. However, the semiconductor device 800 further includes a contact layer 13, for example a poly-Si layer, to contact the gate electrodes 12 with a gate pad (not shown) and to contact the gate electrodes 12a with the first electrode 10. Compared to semiconductor device 700, etching of contacts for the anode region 2a through the insulating layer of the insulating plug 7 avoids the risk of slightly etching an upper portion of the gate dielectric region 8 adjoining anode region 2a.

Figure 9:
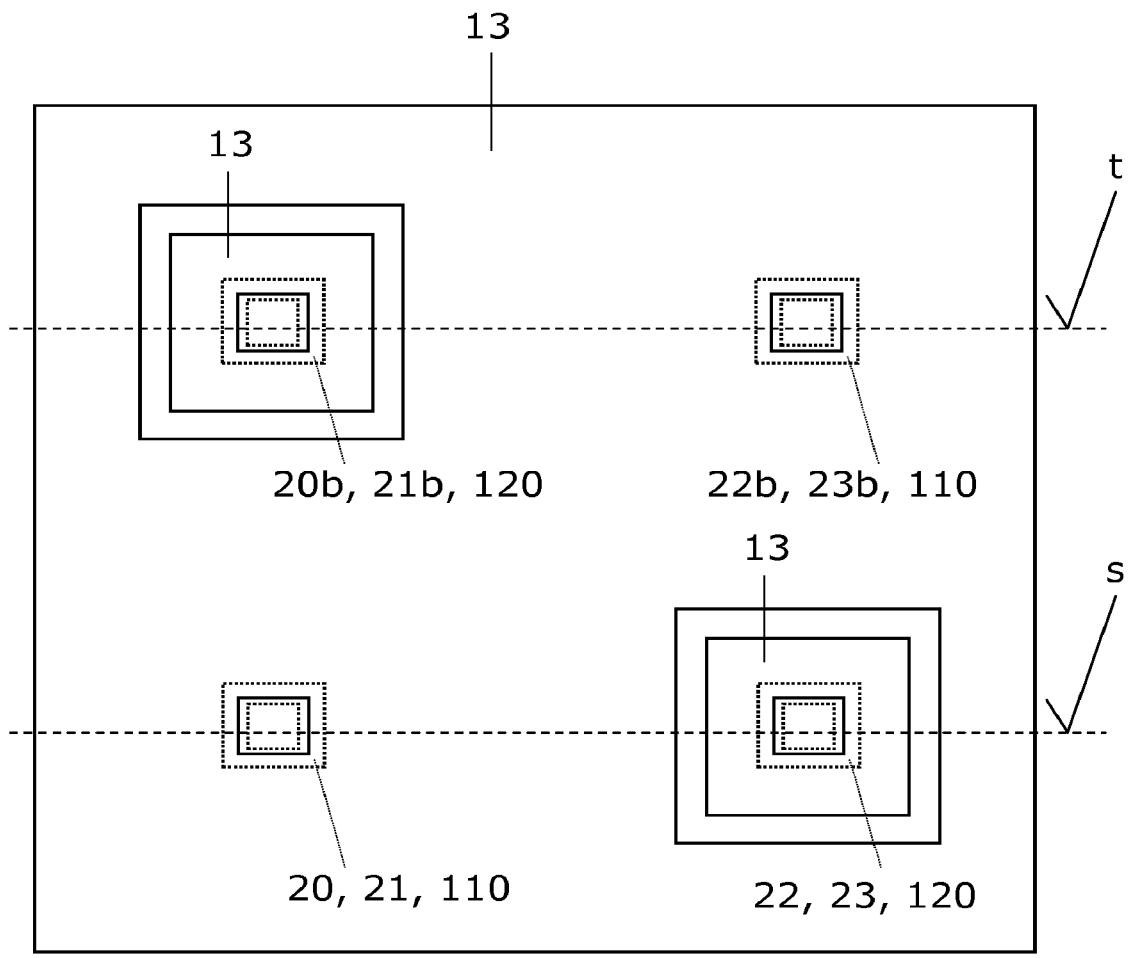
FIG. 9 schematically illustrates a plan view of a vertical semiconductor device as illustrated in FIG. 8 according to one or more embodiments.

FIG. 9 schematically illustrates an embodiment of the semiconductor device 800 in a plan view. FIG. 9 corresponds to a horizontal layout of the contact layer 13. The semiconductor device 800 illustrated in FIG. 8 may correspond to a section along line s in FIG. 9. As already explained with reference to FIG. 1, the vertical trenches of the semiconductor devices disclosed herein may be substantially ring-shaped so that they circumferentially surround, in a horizontal plane, the semiconductor regions of an IGBT-cell 110 or a diode-cell 120. As can be inferred from the overlayed dotted trench layout in FIG. 9, vertical trenches 20 and 21 as well as vertical trenches 22 and 23 form a respective single connected trench, for example hollow rectangular cylinders.

According to an embodiment, the semiconductor device 800 is a power semiconductor device with IGBT-cells 110 and diode-cells 120 that form a regular horizontal lattice as indicated in FIG. 9. For example, the semiconductor device 800 may further include a vertical trench 20b, 21b which forms two separated vertical trenches 20b, 21b when seen in a vertical cross-section along line t and a vertical trench 22b, 23b which forms two separated vertical trenches 22b, 23b when seen in the vertical cross-section along line t. The vertical cross-section along line t may correspond to a horizontally mirrored drawing of FIG. 8.

Figure 10:
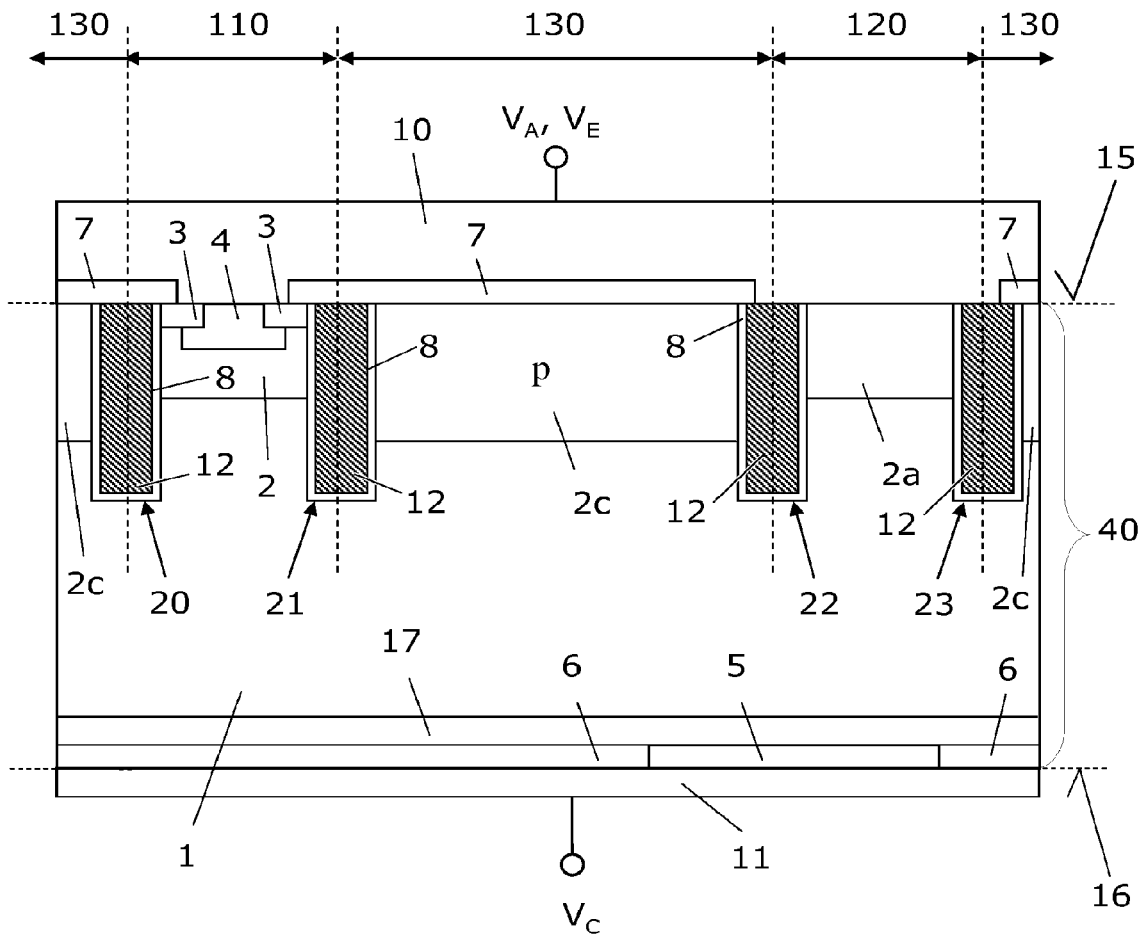
FIG. 10 schematically illustrates a vertical cross-section of a vertical semiconductor device according to one or more embodiments.

FIG. 10 schematically illustrates an embodiment of a semiconductor device 900 in a section of a vertical cross-section. Semiconductor device 900 is similar to semiconductor device 700 and may also be operated as a reverse-conducting IGBT. The semiconductor device 900 also includes a floating body region 2c which extends vertically deeper into the base region 1. However, the floating body region 2c does not extend vertically as deep into the base region 1 as the vertical trenches 20, 21, 22 and 23. The maximum doping concentration of the body region 2 and the floating body region 2a may be substantially equal. Furthermore, the floating body region 2c and the body region 2 may extend into the same vertical depth. Accordingly, manufacturing of semiconductor device 900 may be facilitated.

Figure 11:
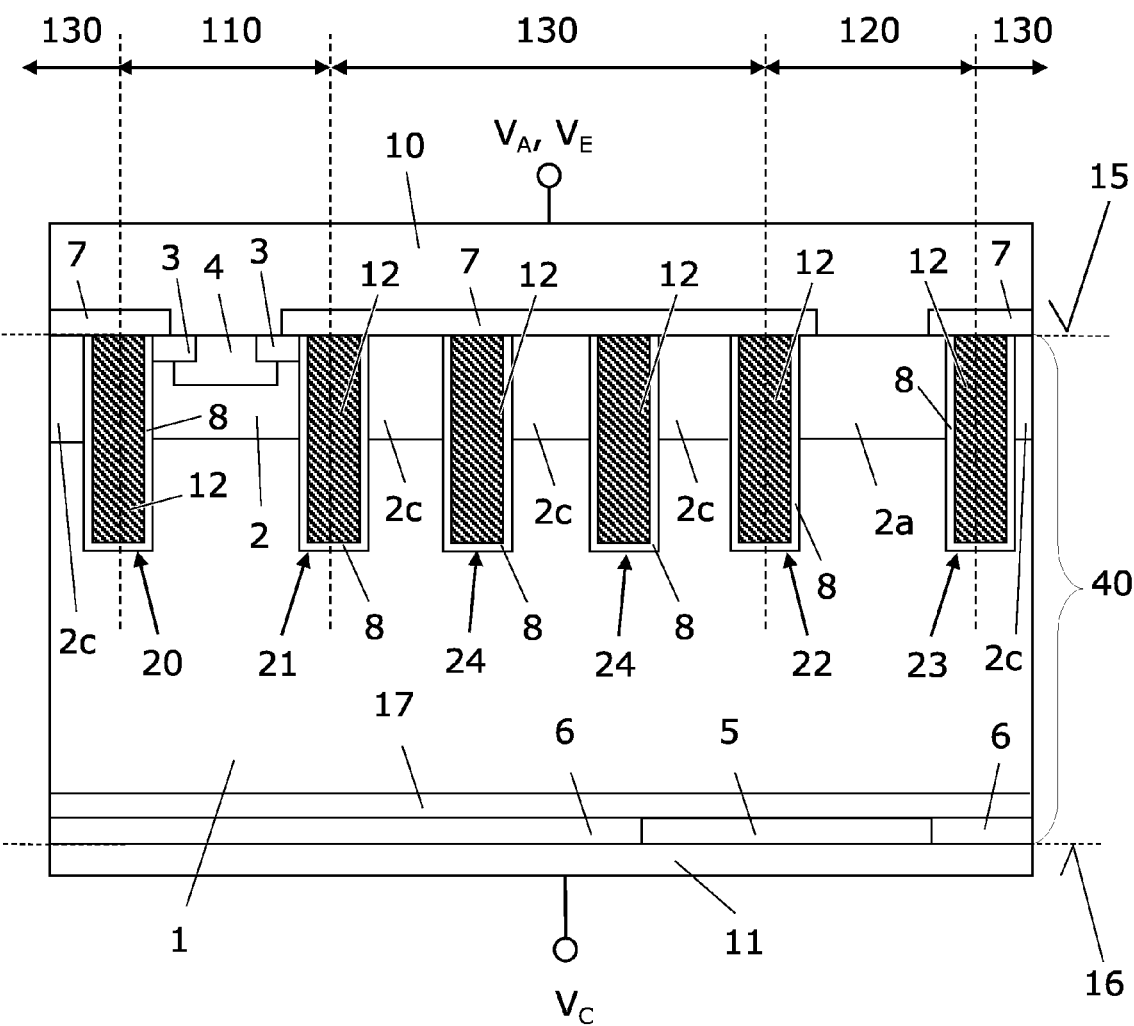
FIG. 11 schematically illustrates a vertical cross-section of a vertical semiconductor device according to one or more embodiments.

FIG. 11 schematically illustrates an embodiment of a semiconductor device 650 in a section of a vertical cross-section. The semiconductor device 650 is similar to semiconductor device 600 and may also be operated as a reverse-conducting IGBT. The semiconductor device 650 also includes floating body regions 2c. However, the floating body regions 2c extend vertically substantially as deep into the base region 1 as the body region 2 and the anode region 2a.

In the exemplary embodiment illustrated in FIG. 11, three floating body regions 2c are arranged between respective trenches 21, 22 and 24 with insulated gate electrodes 12. The floating body region 2c and the body region 2 may be manufactured in common processes. Accordingly, manufacturing of the semiconductor device 650 may be facilitated.

Figure 12:
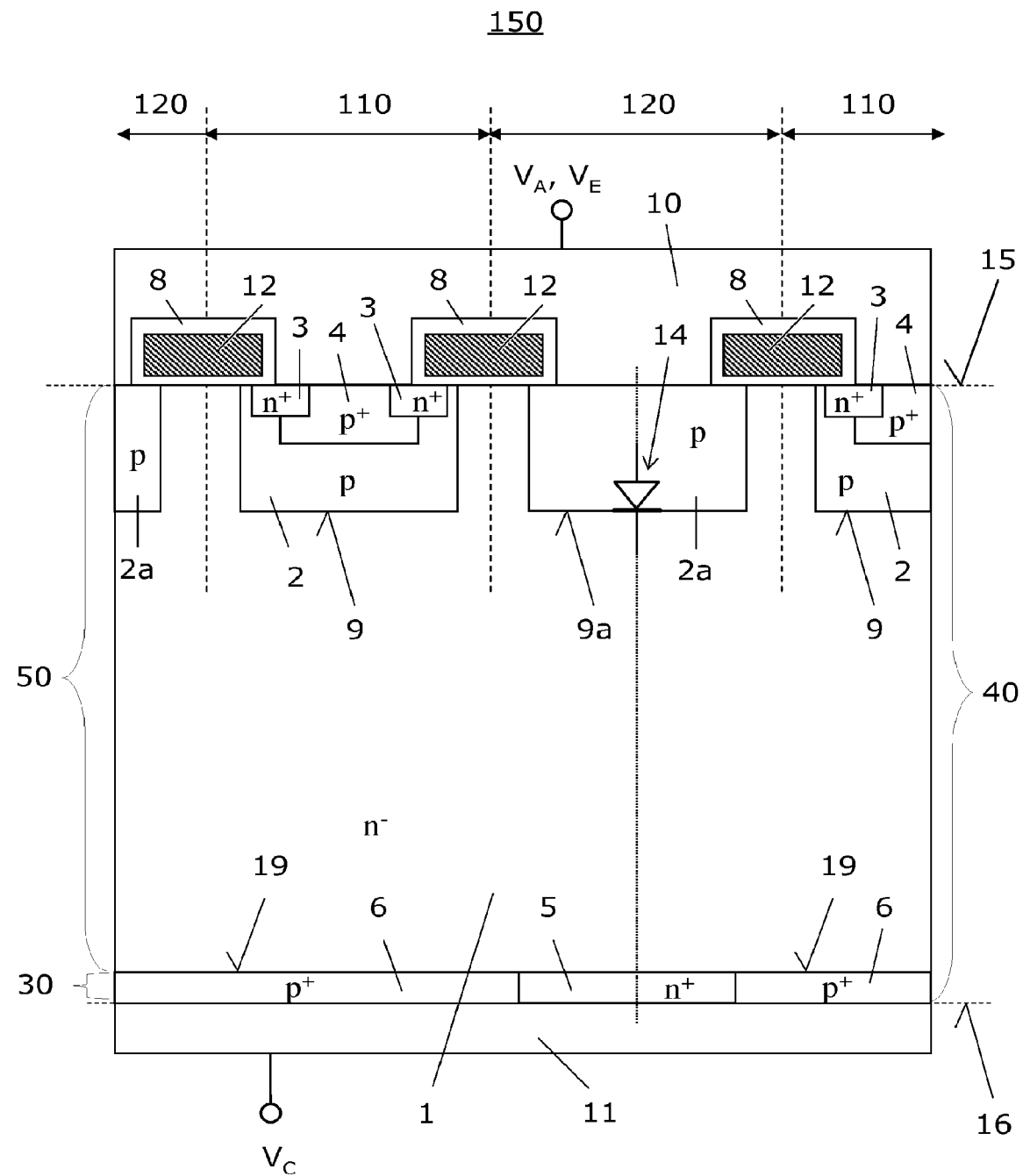
FIG. 12 schematically illustrates a vertical cross-section of a vertical semiconductor device according to one or more embodiments.

FIG. 12 schematically illustrates an embodiment of a semiconductor device 150 in a section of a vertical cross-section. The semiconductor device 150 is similar to semiconductor device 100 and may also be operated as a reverse-conducting IGBT. However, the IGBT-cells 110 and the diode-cells 120 of the semiconductor device 150 include, instead of trench gate electrodes, gate electrodes 12 insulated by respective gate dielectric regions 8 which are arranged on the main horizontal surface 15. The semiconductor device 150 may e.g. be formed as a DMOS-structure (double-diffused metal-oxide semiconductor).

Figure 13:
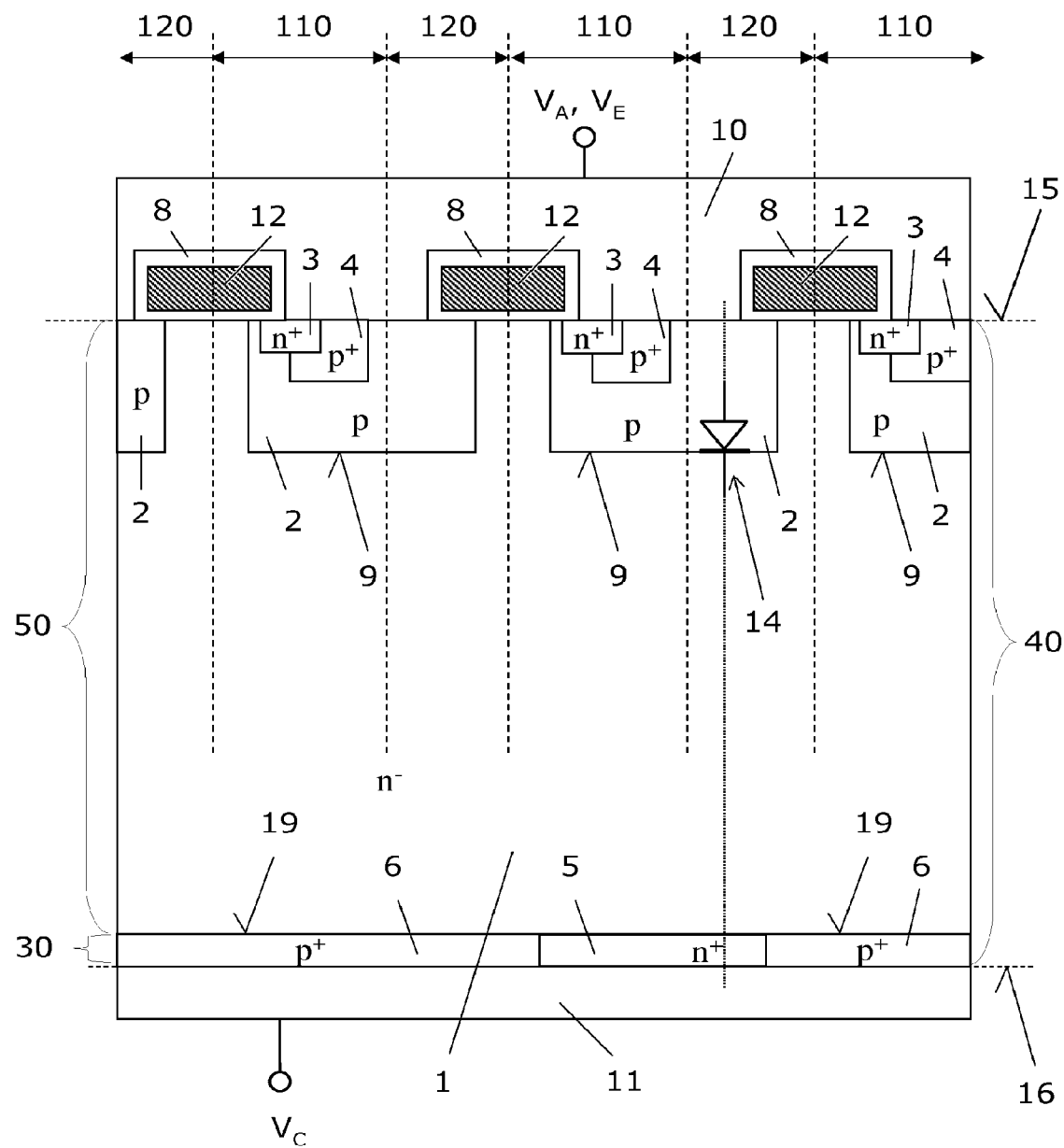
FIG. 13 schematically illustrates a vertical cross-section of a vertical semiconductor device according to one or more embodiments.

FIG. 13 schematically illustrates an embodiment of a semiconductor device 350 in a section of a vertical cross-section. The semiconductor device 350 is similar to semiconductor device 300 and may also be operated as a reverse-conducting IGBT. However, the IGBT-cells 110 and the diode-cells 120 of the semiconductor device 350 include, instead of trench gate electrodes, gate electrodes 12 insulated by respective gate dielectric regions 8 which are arranged on the main horizontal surface 15. The semiconductor device 350 may e.g. be formed as a DMOS-structure.

Spacer-cells with a p-type floating semiconductor region as explained with reference to FIGS. 6 to 11 may also be used for semiconductor devices with gate electrode arranged on the main horizontal surface 15. Furthermore, doping relations and geometric properties of the semiconductor regions explained with reference to FIGS. 1 to 11 typically also apply for semiconductor devices with gate electrode arranged on main horizontal surface 15.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body comprising a base region of a first conductivity type and a main horizontal surface;
a first electrode arranged on the main horizontal surface;
the semiconductor body further comprising, in a vertical cross-section:
a first vertical trench comprising a first gate electrode insulated by a gate dielectric region from the base region;
a second vertical trench comprising a second gate electrode insulated by a gate dielectric region from the base region;
a third vertical trench comprising a third gate electrode insulated by a gate dielectric region from the base region;
a body region of a second conductivity type forming a first pn-junction with the base region and extending between the first vertical trench and the second vertical trench;
at least one source region of the first conductivity type in ohmic contact with the first electrode and arranged between the first vertical trench and the second vertical trench;
at least one anti-latch-up region of the second conductivity type arranged between the first vertical trench and the second vertical trench and in ohmic contact with the first electrode and having a maximum doping concentration which is higher than a maximum doping concentration of the body region;
an anode region of the second conductivity type forming a rectifying pn-junction with the base region only and adjoining the third vertical trench, wherein the anode region is in ohmic contact with the first electrode;
a second electrode arranged opposite the first electrode and in ohmic contact with the base region;
a collector region of the second conductivity type in ohmic contact with the second electrode; and
at least two floating semiconductor regions of the second conductivity type arranged between the second vertical trench and the third vertical trench and at least one fifth vertical trench arranged between two of the at least two floating semiconductor regions of the second conductivity type, the at least one fifth vertical trench comprising a fifth gate electrode insulated by a gate dielectric region from the semiconductor body,
wherein the anode region is arranged between the third vertical trench and a fourth vertical trench, the fourth vertical trench comprising a fourth gate electrode insulated by a gate dielectric region from the anode region.

2. The semiconductor device of claim 1, wherein the anti-latch-up region extends between the first electrode and the body region such that there is no direct ohmic contact between the body region and the first electrode.

3. The semiconductor device of claim 1, wherein the anti-latch-up region extends vertically deeper into the body region than the at least one source region.

4. The semiconductor device of claim 1, wherein the anode region is arranged between the third vertical trench and the second vertical trench.

5. The semiconductor device of claim 1, wherein one of the at least two floating semiconductor regions of the second conductivity type extends vertically deeper into the base region than the body region and the anode region.

6. The semiconductor device of claim 1, wherein one of the at least two floating semiconductor regions of the second conductivity type extends vertically deeper into the base region than the second vertical trench and the third vertical trench.

7. The semiconductor device of claim 1, wherein one of the at least two floating semiconductor regions extends between the second vertical trench and the at least one fifth vertical trench.

8. The semiconductor device of claim 1, wherein one of the at least two floating semiconductor regions extends between the third vertical trench and the at least one fifth vertical trench.

9. The semiconductor device of claim 1, wherein the third gate electrode is electrically connected to the first electrode.

10. The semiconductor device of claim 1, further comprising a contact region of the first conductivity type arranged between the second electrode and the base region and having a maximum doping concentration which is higher than a maximum doping concentration of the base region.

11. The semiconductor device of claim 10, wherein the contact region and the anode region overlap in a projection on a horizontal plane.

12. The semiconductor device of claim 10, further comprising a field-stop zone of the first conductivity type arranged between the base region and the contact region and/or between the base region and the collector region.

13. The semiconductor device of claim 1, wherein the first vertical trench, the second vertical trench and the third vertical trench are arranged in an active area of the semiconductor body, and wherein the semiconductor body further comprises a peripheral area comprising an edge-termination structure.

14. The semiconductor device of claim 1, wherein the anode region extends to the main horizontal surface.

15. The semiconductor device of claim 1, wherein the anode region has a maximum doping concentration which differs from a maximum doping concentration of the body region.

16. The semiconductor device of claim 1, wherein the maximum doping concentration of the anti-latchup region is at least two times higher than the maximum doping concentration of the body region, and wherein a maximum doping concentration of the anode region is lower than the maximum doping concentration of the body region.

17. A semiconductor device, comprising:
a semiconductor body comprising a base region of a first conductivity type and a main horizontal surface;
a first electrode arranged on the main horizontal surface;
the semiconductor body further comprising, in a vertical cross-section:
a first vertical trench comprising a first gate electrode insulated by a gate dielectric region from the base region;
a second vertical trench comprising a second gate electrode insulated by a gate dielectric region from the base region;
a body region of a second conductivity type forming a first pn-junction with the base region and extending between the first vertical trench and the second vertical trench;
a first source region of the first conductivity type in ohmic contact with the first electrode and adjoining the first vertical trench;
a second source region of the first conductivity type in ohmic contact with the first electrode and adjoining the second vertical trench;
at least one anti-latch-up region of the second conductivity type in ohmic contact with the first electrode vertically below the first electrode, and in contact with and arranged between the first vertical trench and the second vertical trench, wherein the anti-latch-up region has a maximum doping concentration which is higher than a maximum doping concentration of the body region, and wherein the body region is in electric contact with the first electrode only via the at least one anti-latch-up region, the first source region and the second source region;
a third vertical trench comprising a third gate electrode insulated by a gate dielectric region from the base region;
an anode region of the second conductivity type in contact with the first electrode and forming a rectifying pn-junction with the base region only and adjoining the third vertical trench,
a second electrode arranged opposite the first electrode and in ohmic contact with the base region;
a collector region of the second conductivity type in ohmic contact with the second electrode; and
at least two floating semiconductor regions of the second conductivity type arranged between the second vertical trench and the third vertical trench and at least one fifth vertical trench arranged between two of the at least two floating semiconductor regions of the second conductivity type, the at least one fifth vertical trench comprising a fifth gate electrode insulated by a gate dielectric region from the semiconductor body,
wherein the anode region is arranged between the third vertical trench and a fourth vertical trench, the fourth vertical trench comprising a fourth gate electrode insulated by a gate dielectric region from the anode region.

18. The semiconductor device of claim 17, wherein the at least one anti-latch-up region extends vertically deeper into the body region than the first source region and the second source region.

19. The semiconductor device of claim 17, wherein the anode region adjoins the second vertical trench at a side of the second vertical trench opposite to the second source region.

20. The semiconductor device of claim 17, wherein the anode region adjoins a third vertical trench, the third vertical trench comprising a third gate electrode insulated by a gate dielectric region from the semiconductor body.

21. The semiconductor device of claim 17, wherein at least one of the third gate electrode and the fourth gate electrode is electrically connected to the first electrode.

22. The semiconductor device of claim 17, wherein the semiconductor device is a reverse conducting IGBT.

* * * * *